(12) United States Patent
Wang et al.

(10) Patent No.: US 11,941,327 B2
(45) Date of Patent: Mar. 26, 2024

(54) CUSTOMIZABLE REINFORCEMENT LEARNING OF COLUMN PLACEMENT IN STRUCTURAL DESIGN

(71) Applicant: AUTODESK, INC., San Francisco, CA (US)

(72) Inventors: Yi Wang, Richmond, CA (US); Mehdi Nourbakhsh, Richmond, CA (US)

(73) Assignee: AUTODESK, INC., San Francisco, CA (US)

( * ) Notice: Subject to any disclaimer, the term of this patent is extended or adjusted under 35 U.S.C. 154(b) by 577 days.

(21) Appl. No.: 17/071,992

(22) Filed: Oct. 15, 2020

(65) Prior Publication Data

US 2022/0083703 A1    Mar. 17, 2022

Related U.S. Application Data

(60) Provisional application No. 63/078,047, filed on Sep. 14, 2020.

(51) Int. Cl.
*G06F 30/13* (2020.01)
*G06F 30/27* (2020.01)
*G06N 20/00* (2019.01)

(52) U.S. Cl.
CPC .............. *G06F 30/13* (2020.01); *G06F 30/27* (2020.01); *G06N 20/00* (2019.01)

(58) Field of Classification Search
CPC .......... G06F 30/13; G06F 30/27; G06N 20/00
See application file for complete search history.

(56) References Cited

U.S. PATENT DOCUMENTS

2019/0026403 A1* 1/2019 De Keyser .............. G06N 5/00
2021/0073449 A1* 3/2021 Segev ................ G06Q 10/0875

FOREIGN PATENT DOCUMENTS

| CN | 111368757 A | | 7/2020 | |
| EP | 3 460 685 A1 | | 3/2019 | |
| WO | WO2016138531 | * | 9/2016 | ............. G06F 17/50 |

OTHER PUBLICATIONS

"Execute" Merriam-webster.com [dictionary]. Retrieved from <<https://www.merriam-webster.com/dictionary/execute>> (Year: 2023).*
"Function" Merriam-webster.com [dictionary]. Retrieved from <<https://www.merriam-webster.com/dictionary/function>> (Year: 2023).*

(Continued)

*Primary Examiner* — Rehana Perveen
*Assistant Examiner* — Alfred H B Wechselberger
(74) *Attorney, Agent, or Firm* — Artegis Law Group, LLP

(57) ABSTRACT

One embodiment of the present invention sets forth a technique for performing machine learning. The technique includes applying one or more placement rules to a floorplan of a building to generate a set of candidate column locations in the floorplan. The technique also includes selecting, using a first reinforcement learning (RL) agent, one or more column locations from the set of candidate column locations based on a structural stability of the one or more column locations. The technique further includes outputting the floorplan that includes the one or more column locations as a structural design for the building.

20 Claims, 4 Drawing Sheets

(56) References Cited

OTHER PUBLICATIONS

"Column Layout Plan for Two Story Building, Part—2: Column layout plan" [blog] (Published Aug. 8, 2020). Retrieved from <<https://www.learneverything.in/2020/08/column-layout-plan.html>> (Year: 2020).*

"How to make Framing Plan | How to locate column Position | Column grid lines | Beam & Slab layout" Youtube.com (Published on Sep. 17, 2020). Retrieved from <<https://www.youtube.com/watch?v=1ZCMyFb6H0M>> (Year: 2020).*

Wolf, A. "Parametric Analysis of Economical Bay Dimensions for Steel Floor Framing" [Thesis] Kansas State University (Year: 2016).*

Shi, F. "Addressing adjacency constraints in rectangular floor plans using Monte-Carlo Tree Search" Addressing adjacency constraints in rectangular floor plans using Monte-Carlo Tree, Automation in Construction; DOI: 10.1016/j.autcon.2020.103187 (Published Apr. 2020) (Year: 2020).*

Liu et al. "Automated clash resolution for reinforcement steel design in concrete frames via Q-learning and Building Information Modeling" Automation in Construction vol. 112 (Published Jan. 2020) (Year: 2020).*

Goodman, G. "A Machine Learning Approach to Artificial Floorplan Generation" [Thesis] University of Kentucky; DOI: 10.13023/etd.2019.391 (Year: 2019).*

Miles et al. "The conceptual design of commercial buildings using a genetic algorithm" Computers and Structures, vol. 79, pp. 1583-1593 (Year: 2001).*

Choi et al. "An Intelligent, Integrated Building Design System" [Conference Paper] Eleventh East Asia-Pacific Conference on Structural Engineering & Construction (EASEC-11) "Building a Sustainable Environment" (Year: 2008).*

Extended European Search Report for Application No. 21196583.5 dated Feb. 15, 2022.

* cited by examiner

US 11,941,327 B2

CUSTOMIZABLE REINFORCEMENT LEARNING OF COLUMN PLACEMENT IN STRUCTURAL DESIGN

CROSS-REFERENCE TO RELATED APPLICATIONS

This application claims priority benefit of the U.S. Provisional Application titled "TECHNIQUES FOR PLACING COLUMNS IN STRUCTURAL DESIGNS," filed Sep. 14, 2020 and having Ser. No. 63/078,047. The subject matter of this related application is hereby incorporated herein by reference.

BACKGROUND

Field of the Various Embodiments

Embodiments of the present disclosure relate generally to structural design, and more specifically, to customizable reinforcement learning of column placement in structural design.

Description of the Related Art

In structural design, structural engineers typically place columns in floorplans of architectural building designs provided by their clients. For example, a structural engineer may use structural design software to analyze the location and alignment of walls, types of rooms, and other factors and identify a number of "gridlines" in a floorplan. After finding these gridlines in horizontal and vertical directions, the structural engineer may use the structural design software to place columns at the intersections of the gridlines.

This process is tedious and time-consuming, especially in buildings that do not have the same architectural layout on every floor (e.g., residential buildings). In these projects, structural engineers need to review each floor's layout multiple times to identify overlap in the locations of the walls. For example, a structural engineer may check the vertical alignments of interior walls on each floor to ensure that a column on one floor does not appear in the middle of an open space on another story. In residential projects with medium complexity, structural engineers may spend five days or a week finding column locations.

Moreover, structural engineers frequently utilize expert knowledge in the form of design rules to place columns or make other types of structural design choices. Examples of these rules include avoiding the placement of columns inside rooms or requiring columns to form a gridline. While machine learning techniques can be used to capture these rules and assist structural engineers with column placement, training of conventional machine learning models typically requires significant amounts of data to allow the models to "learn" to apply the rules to different types of designs or projects. Moreover, a change in the rules and/or data requires retraining of the model, which consumes significant time and resources and delays the release or use of the latest version of the model.

As the foregoing illustrates, what is needed in the art are techniques for efficiently capturing and applying design rules to column placement tasks in structural design.

SUMMARY

One embodiment of the present invention sets forth a technique for performing machine learning. The technique includes applying one or more placement rules to a floorplan of a building to generate a set of candidate column locations in the floorplan. The technique also includes selecting, using a first reinforcement learning (RL) agent, one or more column locations from the set of candidate column locations based on a structural stability of the one or more column locations. The technique further includes outputting the floorplan that includes the one or more column locations as a structural design for the building.

By allowing a user to define, select, and/or customize placement rules for a column placement task and executing an RL agent that carries out the column placement task according to the placement rules, the disclosed techniques expedite and/or automate the column placement task for the user. As a result, the column placement task may be performed more efficiently and/or consume fewer resources than conventional column placement tools that are run by users over a number of hours or days to manually identify and review column locations in floorplans. Consequently, the disclosed techniques provide technological improvements in computer systems, applications, tools, and/or techniques for performing column placement.

BRIEF DESCRIPTION OF THE DRAWINGS

So that the manner in which the above recited features of the various embodiments can be understood in detail, a more particular description of the inventive concepts, briefly summarized above, may be had by reference to various embodiments, some of which are illustrated in the appended drawings. It is to be noted, however, that the appended drawings illustrate only typical embodiments of the inventive concepts and are therefore not to be considered limiting of scope in any way, and that there are other equally effective embodiments.

DETAILED DESCRIPTION

In the following description, numerous specific details are set forth to provide a more thorough understanding of the various embodiments. However, it will be apparent to one of skilled in the art that the inventive concepts may be practiced without one or more of these specific details.

System Overview

Figure 1:
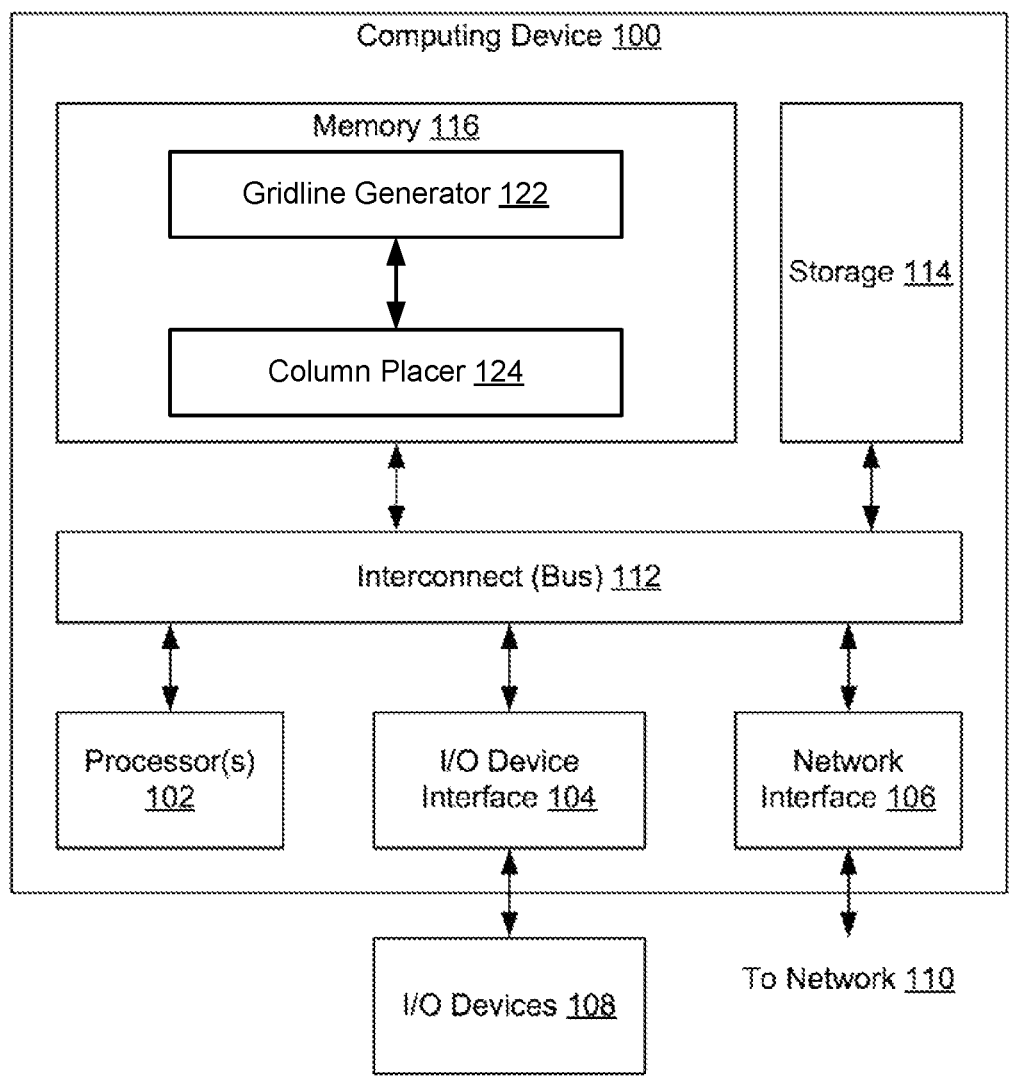
FIG. 1 illustrates a system configured to implement one or more aspects of various embodiments.

FIG. 1 illustrates a computing device 100 configured to implement one or more aspects of various embodiments. In one embodiment, computing device 100 may be a desktop computer, a laptop computer, a smart phone, a personal digital assistant (PDA), tablet computer, or any other type of computing device configured to receive input, process data, and optionally display images, and is suitable for practicing one or more embodiments. Computing device 100 is configured to run a gridline generator 122 and column placer 124 that reside in a memory 116. It is noted that the computing device described herein is illustrative and that any other technically feasible configurations fall within the scope of the present disclosure. For example, multiple instances of gridline generator 122 and column placer 124 may execute on a set of nodes in a distributed system to implement the functionality of computing device 100.

In one embodiment, computing device 100 includes, without limitation, an interconnect (bus) 112 that connects one or more processing units 102, an input/output (I/O) device interface 104 coupled to one or more input/output (I/O) devices 108, memory 116, a storage 114, and a network interface 106. Processing unit(s) 102 may be any suitable processor implemented as a central processing unit (CPU), a graphics processing unit (GPU), an application-specific integrated circuit (ASIC), a field programmable gate array (FPGA), an artificial intelligence (AI) accelerator, any other type of processing unit, or a combination of different processing units, such as a CPU configured to operate in conjunction with a GPU. In general, processing unit(s) 102 may be any technically feasible hardware unit capable of processing data and/or executing software applications. Further, in the context of this disclosure, the computing elements shown in computing device 100 may correspond to a physical computing system (e.g., a system in a data center) or may be a virtual computing instance executing within a computing cloud.

In one embodiment, I/O devices 108 include devices capable of providing input, such as a keyboard, a mouse, a touch-sensitive screen, and so forth, as well as devices capable of providing output, such as a display device. Additionally, I/O devices 108 may include devices capable of both receiving input and providing output, such as a touchscreen, a universal serial bus (USB) port, and so forth. I/O devices 108 may be configured to receive various types of input from an end-user (e.g., a designer) of computing device 100, and to also provide various types of output to the end-user of computing device 100, such as displayed digital images or digital videos or text. In some embodiments, one or more of I/O devices 108 are configured to couple computing device 100 to a network 110.

In one embodiment, network 110 is any technically feasible type of communications network that allows data to be exchanged between computing device 100 and external entities or devices, such as a web server or another networked computing device. For example, network 110 may include a wide area network (WAN), a local area network (LAN), a wireless (WiFi) network, and/or the Internet, among others.

In one embodiment, storage 114 includes non-volatile storage for applications and data, and may include fixed or removable disk drives, flash memory devices, and CD-ROM, DVD-ROM, Blu-Ray, HD-DVD, or other magnetic, optical, or solid state storage devices. Gridline generator 122 and column placer 124 may be stored in storage 114 and loaded into memory 116 when executed.

In one embodiment, memory 116 includes a random access memory (RAM) module, a flash memory unit, or any other type of memory unit or combination thereof. Processing unit(s) 102, I/O device interface 104, and network interface 106 are configured to read data from and write data to memory 116. Memory 116 includes various software programs that can be executed by processor(s) 102 and application data associated with said software programs, including gridline generator 122 and column placer 124.

During operation, gridline generator 122 and column placer 124 perform column placement in an architectural design. More specifically, gridline generator 122 generates gridlines for a floorplan in the architectural design, and column placer 124 uses one or more machine learning models to place columns at the intersections of the gridlines. As described in further detail below, such column placement may be performed in a rules-driven and/or interactive manner without requiring retraining of the machine learning models, thereby reducing resource consumption and/or user overhead associated with carrying out column placement tasks in structural design.

Customizable Reinforcement Learning of Column Placement in Structural Design

Figure 2:
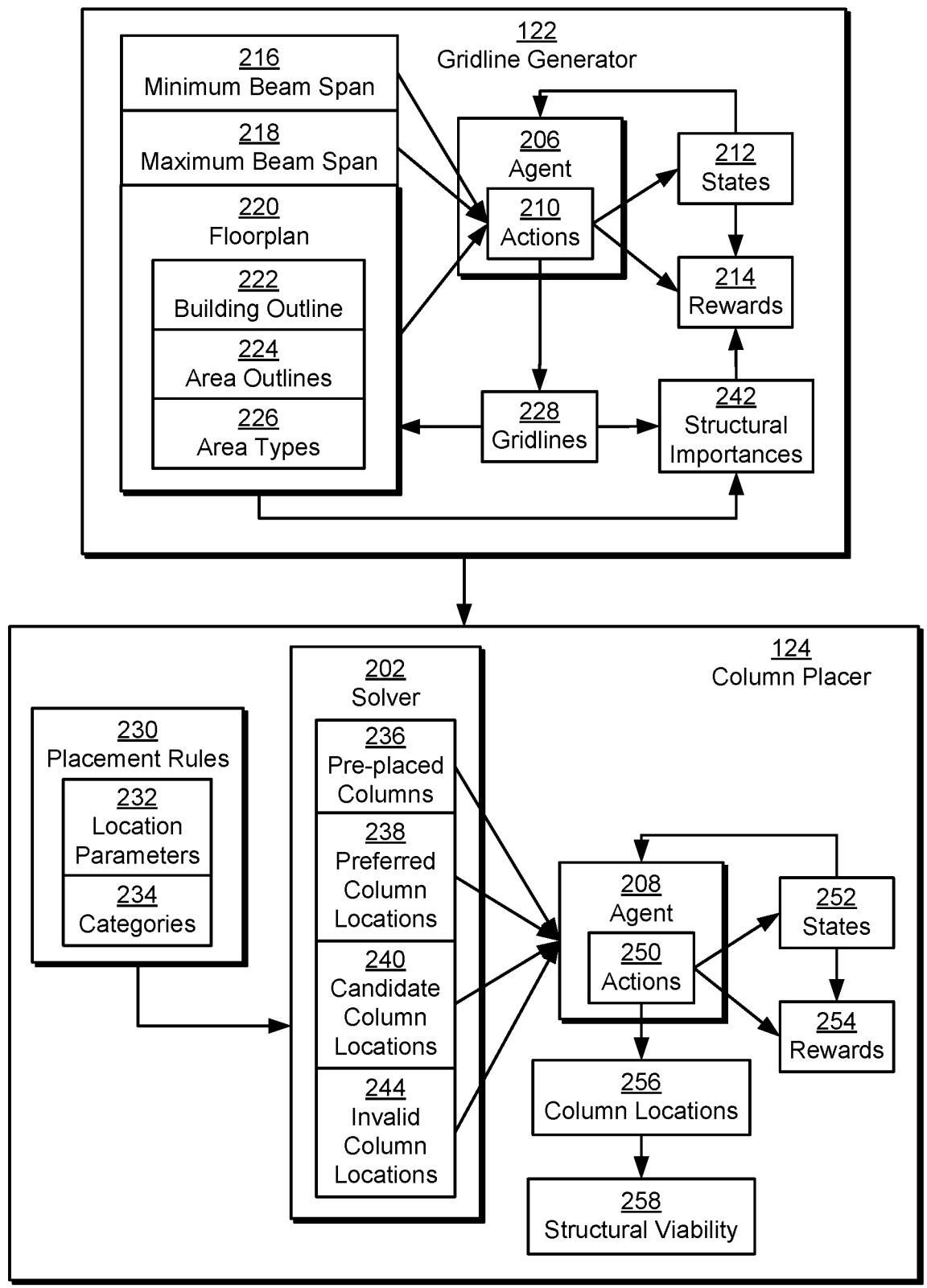
FIG. 2 is a more detailed illustration of the gridline generator and column placer of FIG. 1, according to various embodiments.

FIG. 2 is a more detailed illustration of gridline generator 122 and column placer 124 of FIG. 1, according to various embodiments. As mentioned above, gridline generator 122 adds a set of gridlines 228 to a floorplan 220 in an architectural design of a building, and column placer 124 performs column placement in floorplan 220 by identifying column locations 256 at the intersections of some or all gridlines 228.

As shown, floorplan 220 includes a building outline 222, one or more area outlines 224, and one or more area types 226. Building outline 222 defines the outline of a given story of the building represented by floorplan 220, and each of area outlines 224 defines an outline of a specific area (e.g., room, region, zone, etc.) in the same story. For example, building outline 222 may be specified using coordinates ($x_0$, $y_0$) and ($x_1$, $y_1$), which represent the top left and bottom right corners of a rectangular boundary for the building story. Similarly, each area outline may be identified by a unique "area ID" and coordinates ($x_0$, $y_0$) and ($x_1$, $y_1$). Additional coordinates and/or other representations of building outline 222 and/or area outlines 224 may be used for non-rectangular building and/or area shapes.

Area types 226 specify the functional uses of the corresponding areas in floorplan 220. For example, each area type may be represented by the "area ID" of a corresponding area and a categorical functional type, such as (but not limited to) "office," "conference room," "reception," "stairwell," "elevator," "kitchen," "bathroom," and/or "phone booth."

In some embodiments, gridline generator 122 executes a reinforcement learning (RL) agent 206 that generates gridlines 228 that overlap with walls and/or other structural elements of the building. For example, gridline generator 122 may use agent 206 to place horizontal and vertical gridlines 228 that align with walls of rectangular rooms or spaces in floorplan 220.

More specifically, agent 206 generates gridlines 228 in floorplan 220 based on a minimum beam span 216 of beams used in the building, a maximum beam span 218 of beams used in the building, and structural importances 242 associated with walls in floorplan 220. When floorplan 220 includes a rectangular building outline 222 and rectangular area outlines 224, gridline generator 122 may collect walls that run along the same direction (e.g., the x- and y-axes) in floorplan 220. Each wall is associated with a weight representing the structural importance of the wall; a larger weight indicates a higher structural importance (e.g., a load-bearing wall), and a smaller weight indicates a lower structural importance (e.g., a non-load-bearing partition wall). Agent 206 then places gridlines 228 to maximize the sum of the weights of walls that overlap with gridlines 228, subject to the constraint that the distance between any two consecutive gridlines is greater than or equal to minimum beam span 216 and less than or equal to maximum beam span 218.

The operation of gridline generator 122 and/or agent 206 may be illustrated using each axis k ∈ {x, y} and an orthogonal axis $$\bar{k} = \begin{cases} y \text{ if } k \text{ is } x \\ x \text{ if } k \text{ is } y \end{cases}.$$

Assuming that all walls in floorplan 220 are orthogonal to one another (ice parallel to the x- or y-axis), each wall w that is parallel to the k axis is represented by a k coordinate of the wall's location and a weight wt(w) indicating the structural importance of the wall. A set of gridlines 228 $GD_k$ orthogonal to the k-axis is represented by a set of k coordinates, which are selected in a way that maximizes Coverage($GD_k$) according to the following definition:

$$\text{Coverage}(GD_k) = \sum_{gd \in GD_k} wt(w),$$

where gd coincides with the k coordinate of some wall w that is parallel to the k axis. Gridlines 228 are additionally selected such that for the distance dist between any two gridlines 228 $gd_1$, $gd_2$ E $GD_k$, minSpan≤dist≤maxSpan, where minSpan denotes minimum beam span 216 and maxSpan denotes maximum beam span 218.

As a result, gridline generator 122 and/or another component may train agent 206 to approximately maximize Coverage($GD_k$). In particular, for any sequence of real numbers x={$x_1$, $x_2$, . . . , $x_n$} and a number g, x |$_g$ denotes the sequence of real numbers obtained from x by removing all x ∈ x such that x≤g, and x-y denotes the sequence of real numbers obtained from by subtracting y from every element in x. Individual states 212 w associated with agent 206 are represented by sequences of k coordinates, and individual actions 210 associated with agent 206 are represented by act ∈ [minSpan, maxSpan]. A state transition ƒ(w, act) is defined as ƒ(w, act)=w|act-y, and the reward function r(w, act) is defined as:

$$f(w, \text{act}) = \begin{cases} wt(w), & \text{if act coincides with the k-coordinate of a wall} \\ 0 & \text{otherwise} \end{cases}$$

A terminating state is reached when there is only one w ∈ w and w<minSpan.

In one or more embodiments, agent 206 is trained using randomly generated sequences of walls. For example, the component may use a Deep Deterministic Policy Gradients (DDPG) technique to learn a policy for agent 206 so that actions 210 performed by agent 206 produce horizontal and vertical gridlines 228 along walls with high structural importances 242 in floorplan 220.

After gridlines 228 are added to floorplan 220, column placer 124 identifies column locations 256 of columns in floorplan 220. First, column placer 124 uses a solver 202 to convert one or more placement rules 230 into geometric constraints that are applied to gridline intersections representing potential column locations 256 in floorplan 220. For example, solver 202 may include an Answer Set solver that applies geometric constraints represented by placement rules 230 to some or all intersections of gridlines 228 in floorplan 220.

In some embodiments, placement rules 230 represent user-specified requirements for column placement. For example, each placement rule may be provided by a structural engineer and/or another user involved in structural design of the building. Thus, placement rules 230 accumulated across multiple users, floorplans, and/or structural design projects may reflect the domain knowledge of structural engineers with respect to column placement tasks. Within this domain knowledge, one or more placement rules 230 may be selected or specified for column placement within a given floorplan 220. For example, a user may interact with a user interface provided by column placer 124 and/or another component to define a new placement rule and/or select a "saved" placement rule for use with floorplan 220.

As shown, placement rules 230 include location parameters 232 representing potential column locations 256 (e.g., intersections of gridlines 228 in floorplan 220), as well as categories 234 associated with those locations. In some embodiments, categories 234 include pre-placed columns 236, preferred column locations 238, candidate column locations 240, and/or invalid column locations 244. Pre-placed columns 236 include gridline intersections at which columns are required, preferred column locations 238 include gridline intersections at which columns are preferred, candidate column locations 240 include gridline intersections at which columns can be placed, and invalid column locations 244 include gridline intersections at which columns cannot be placed.

For example, each placement rule may include a predicate that specifies a category. A predicate of pre_placed(x, y) indicates that a location represented by the coordinates (x, y) is to be included in pre-placed columns 236, a predicate of column_forbidden(x, y) indicates that a location represented by the coordinates (x, y) is to be included in invalid column locations 244, and a predicate of column_preferred(x, y) indicates that a location represented by the coordinates (x, y) is to be included in preferred column locations 328. Gridline intersections in floorplan 220 that are not found in invalid column locations 244 or pre-placed columns 236 may be included in candidate column locations 240.

Location parameters 232 specify various regions of floorplan 220, such as (but not limited to) specific area types 226, locations along building outline 222 and/or certain area outlines 224, and/or locations that lie within building outline 222 and/or certain area outlines 224. Continuing with the above example, each placement rule includes one or more location parameters 232 following the predicate that identify the location(s) of gridline intersections to which the category denoted by the predicate is to be applied. Thus, a placement rule of pre_placed(x, y):-building_corner(x, y) specifies that (x, y) locations representing corners of the building (e.g., as defined by building outline 222) are to be included in pre-placed columns 236. A placement rule of pre_placed(x, y):-room_corner(x, y), element_function(r, stairwell) specifies that (x, y) locations representing corners of areas (e.g., as defined by area outlines 224) with area types 226 of "stairwell" are to be included in pre-placed columns 236. A placement rule of column_forbidden(x, y):-in_the_middle_of(r, x, y), element_function(r, conference_room) specifies that locations in the middle of areas with area types 226 of "conference_room" are to be included in invalid column locations 244.

After solver 202 identifies pre-placed columns 236, preferred column locations 238, candidate column locations 240, and/or invalid column locations 244 in floorplan 220, column placer 124 executes another RL agent 208 that specifies column locations 256 in floorplan 220, given the output of solver 202. More specifically, a column placement task CPT performed by agent 208 is represented by the following tuple:

$$CPT=(shape,C,PR,PP,maxSpan,m)$$

In the above tuple, shape is the polygon defining the interior of floorplan 220; C, PR, and PP are sets of points; and PR $\subseteq$ C and PP $\subseteq$ C. C represents candidate column locations 240, PR represents preferred column locations 238, and PP represents locations of pre-placed columns 236 identified by solver 202. Invalid column locations 244 are applied by omitting the corresponding gridline intersections from candidate column locations 240 and/or floorplan 220 provided to agent 208. In addition, maxSpan is a positive number representing the maximum beam span, and m is a positive integer denoting the maximum number of columns allowed in floorplan 220.

Continuing with the above column placement task, a column placement CP is a set of points representing column locations 256 in floorplan 220. CP is a solution of CPT if CP $\subseteq$ C, PP $\subseteq$ CP, and CP has a structural viability 258 that meets or exceeds a threshold, according to a structural simulator. A naïve technique for determining structural viability 258 includes verifying that for every point p in shape, there exists a column c ∈ CP such that the distance between p and c is less than or equal to maxSpan. Other techniques for assessing structural viability 258, including finite element analysis and/or other types of structural simulation or machine learning techniques, may be used in lieu of or in addition to the naïve technique.

In one or more embodiments, agent 208 is trained and/or executed to perform the column placement task by performing actions 250 that select column locations 256 in floorplan 220. Individual states 252 associated with agent 208 are represented by "snapshots" or "images" of floorplan 220 that include the following information: candidate column locations 240 C, preferred column locations 238 PR, existing column locations 256 CP, and the area CA of floorplan 220 covered by existing column locations 256 (i.e., for all points p in CA, there exists a column c in CP such that the distance between p and c is less than or equal to maxSpan).

In other words, an action is a column location c in C selected by agent 208. For a given state S, S+c represents the state obtained from S by placing a column at c and updating the covered area CA. In turn, the transition function $f(S, c)$ is defined as:

$$f(S, c) = \begin{cases} S+c & \text{if } c \text{ is not already placed with a column} \\ S & \text{otherwise} \end{cases}$$

Agent 208 enters a terminating state when the covered area CA includes the entire interior of floorplan 220, the number of placed columns has reached the maximum m, and/or the number of actions 250 has reached a threshold for "maximum steps." Rewards 254 are calculated according to the following reward function r(S, c):

$$r(S, c) = \begin{cases} cvd(S+c)\ldots cvd(S) + rwd_{prefer} + rwd_{full} \\ \quad \text{if } S+c \text{ covere the floorplan's interior and} \\ \quad c \text{ is a preferred column location} \\ cvd(S+c)\ldots cvd(S) + rwd_{full} \\ \quad \text{if } S+c \text{ covere the floorplan's interior and} \\ \quad c \text{ is not a preferred column location} \\ cvd(S+c)\ldots cvd(S) + rwd_{prefer} \\ \quad \text{if } S+c \text{ does not covere the floorplan's interior and} \\ \quad c \text{ is a preferred column location} \\ cvd(S+c)\ldots cvd(S) \\ \quad \text{if } S+c \text{ does not covere the floorplan's interior and} \\ \quad c \text{ is not a preferred column location} \end{cases}$$

In the above reward function, cvd(S') for a state S' represents the percentage of floorplan 220 interior that is represented by the covered area CA, $rwd_{prefer}$ is a reward for each column placed at a preferred column location, and $rwd_{full}$ is a reward for reaching 100% structural coverage of the interior of floorplan 220 with column locations 256. Consequently, agent 206 may select column locations 256 that represent preferred column locations 238, increase the covered area CA, and/or reach 100% structural coverage of the interior of floorplan 220.

Like agent 206, agent 208 may be trained using randomly synthesized floorplans. For example, column placer 124 and/or another component may use a Proximal Policy Optimization (PPO) technique to learn a policy for agent 208 so that actions 254 performed by agent 206 maximize the placement of columns in preferred column locations 238, produce a structurally viable floorplan 220, and/or increase or complete structural coverage of the interior of floorplan 220 (as determined by the covered area CA).

In one or more embodiments, column placer 124 includes functionality to perform interactive column placement, in which a structural engineer and/or another user interacts with column placer 124 and/or agent 208 to carry out a column placement task. During this interactive column placement, the user provides and/or updates placement rules 230 associated with floorplan 220, and solver 220 identifies gridline intersections corresponding to pre-placed columns 236, preferred column locations 238, candidate column locations 240, and/or invalid locations 244 based on placement rules 230. Agent 208 then selects structurally viable column locations 256 from preferred column locations 238 and candidate column locations 240, and column placer 124 outputs floorplan 220 with column locations 256 to the user and provides the user the opportunity to further revise placement rules 230. If a conflict is found in a given set of placement rules 230 (e.g., if one placement rule contradicts another), column placer 124 may generate an alert that identifies the conflict and request that the user resolve the conflict (e.g., by modifying one or more placement rules 230) prior to updating column locations 256 to reflect the set of placement rules.

Consequently, column placer 124 and the user may iteratively interact with one another to specify select column locations 256 in floorplan 220 until a set of structurally viable column locations 256 that meets the user's requirements is generated, as described in further detail below with respect to FIGS. 3A-3C. Moreover, this iterative process may be performed without retraining agent 208, which improves resource consumption and/or adaptability over conventional machine learning techniques that require retraining of a machine learning model whenever changes to the behavior of the machine learning model are desired.

The system of FIG. 2 additionally includes functionality to store and/or reuse placement rules 230 with different floorplans and/or structural design projects. For example, column placer 124 and/or another component may store each user-defined placement rule in a database and/or another type of data store. The component may also allow placement rules 230 to be grouped under various users, project types, and/or other categories or "tags." During a column placement task for a new project and/or floorplan, a user may create or modify one or more placement rules 230 for the task, select individual placement rules 230 from the data store for use with the task, and/or select one or more groups of placement rules 230 for use with the task. This storing, grouping, and reuse of placement rules 230 over multiple floorplans, projects, and/or column placement tasks allows the domain knowledge and/or expertise of structural engineers and/or other domain experts to be captured and reused, even when the domain experts are no longer involved in subsequent projects.

Figure 3A:
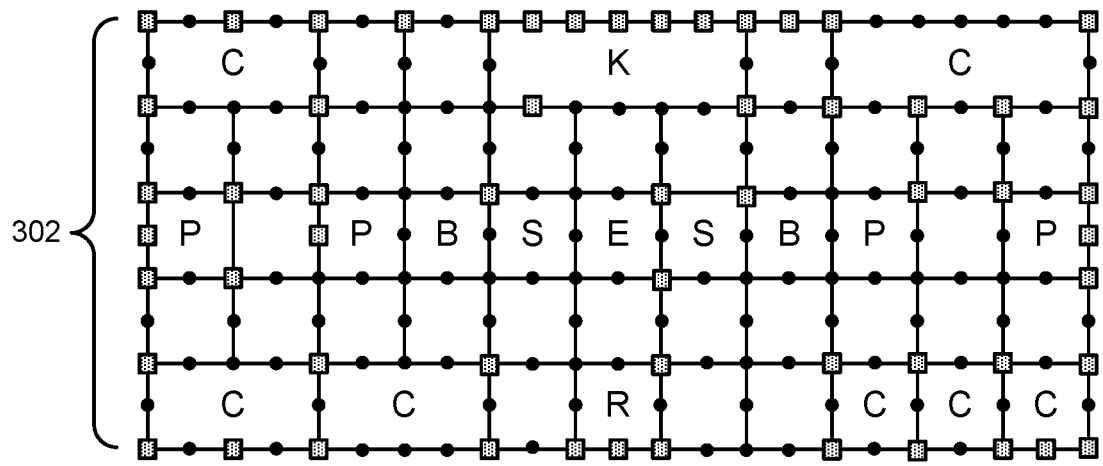
FIG. 3A is an example floorplan generated by the gridline generator and column placer of FIG. 1, according to various embodiments.

FIG. 3A is an example floorplan 302 generated by gridline generator 122 and column placer 124 of FIG. 1, according to various embodiments. In floorplan 302, "C" indicates a conference room, "K" indicates a kitchen, "P" indicates a phone booth, "B" indicates a bathroom, "E" indicates an elevator, "S" indicates a stairwell, and "R" indicates a reception area. Squares along the edges and/or corners of horizontal and vertical lines in floorplan 302 indicate column placements, and dots along the edges and/or corners of the horizontal and vertical lines in floorplan 302 indicate candidate column locations 240 in floorplan 302 that have not been placed with columns.

More specifically, FIG. 3A shows an example floorplan 302 with column placements by column placer 124 that reflect a placement rule that prevents columns from being placed in the middle of a room. As shown, floorplan 302 lacks candidate column locations and/or column placements in the interior of areas marked with "C," "K," "P," "B," "E," "S," and "R," indicating that solver 202 has designated gridline intersections in the interiors of rooms as invalid column locations 244 in floorplan 302.

In addition, column placements in floorplan 302 are not evenly distributed throughout floorplan 302 and do not account for load-bearing walls around the stairwells and elevator and/or other areas of floorplan 302. As a result, a user may change the placement rules associated with floorplan 302 to trigger a new set of column placements that better reflect the users' design goals and/or preferences.

Figure 3B:
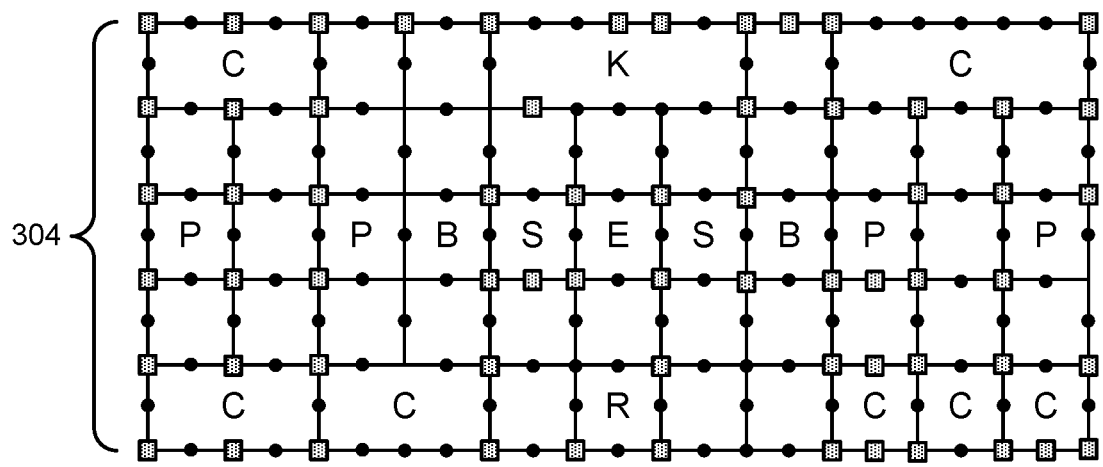
FIG. 3B is an example floorplan generated by the gridline generator and column placer of FIG. 1, according to various embodiments.

FIG. 3B is an example floorplan 304 generated by gridline generator 122 and column placer 124 of FIG. 1, according to various embodiments. More specifically, floorplan 304 includes floorplan 302 of FIG. 3A with a revised set of column placements after a new placement rule requiring columns around stairwells is specified. For example, column placer 124 may automatically generate and output floorplan 304 after a user creates and submits the new placement rule for use with the floorplan in a user interface provided by column placer 124 and/or another component.

As shown, floorplan 304 includes columns at the corners of both stairwells. These columns may include pre-placed columns 236 that are generated by solver 202 to accommodate constraints represented by the new placement rule. In response to the newly added columns around the stairwells, agent 206 may place fewer columns around the kitchen and/or other areas in floorplan 304 (e.g., to stay within the maximum number of columns allowed for the column placement task).

Figure 3C:
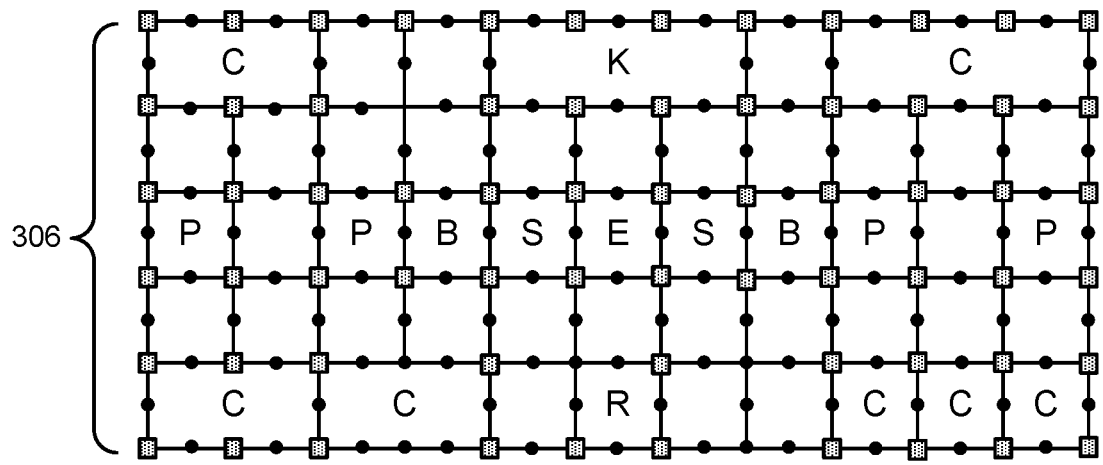
FIG. 3C is an example floorplan generated by the gridline generator and column placer of FIG. 1, according to various embodiments.

FIG. 3C is an example floorplan 306 generated by gridline generator 122 and column placer 124 of FIG. 1, according to various embodiments. In particular, floorplan 306 includes floorplans 302-304 of FIGS. 3A and 3B with a revised set of column placements after a new placement rule identifying room corners as preferred column locations 238 is defined.

In response to the new placement rule, solver 202 designates corners of areas marked with "C," "K," "P," "B," "E," "S," and "R" as preferred column locations 238, and agent 206 places columns at the corners. Column placements in floorplan 306 are also more evenly spaced and/or distributed than those in floorplan 302 or 304. Consequently, column locations in floorplan 306 may align better with the requirements of the user interacting with column placer 124 and/or result in a structural design with higher structural integrity.

Figure 4:
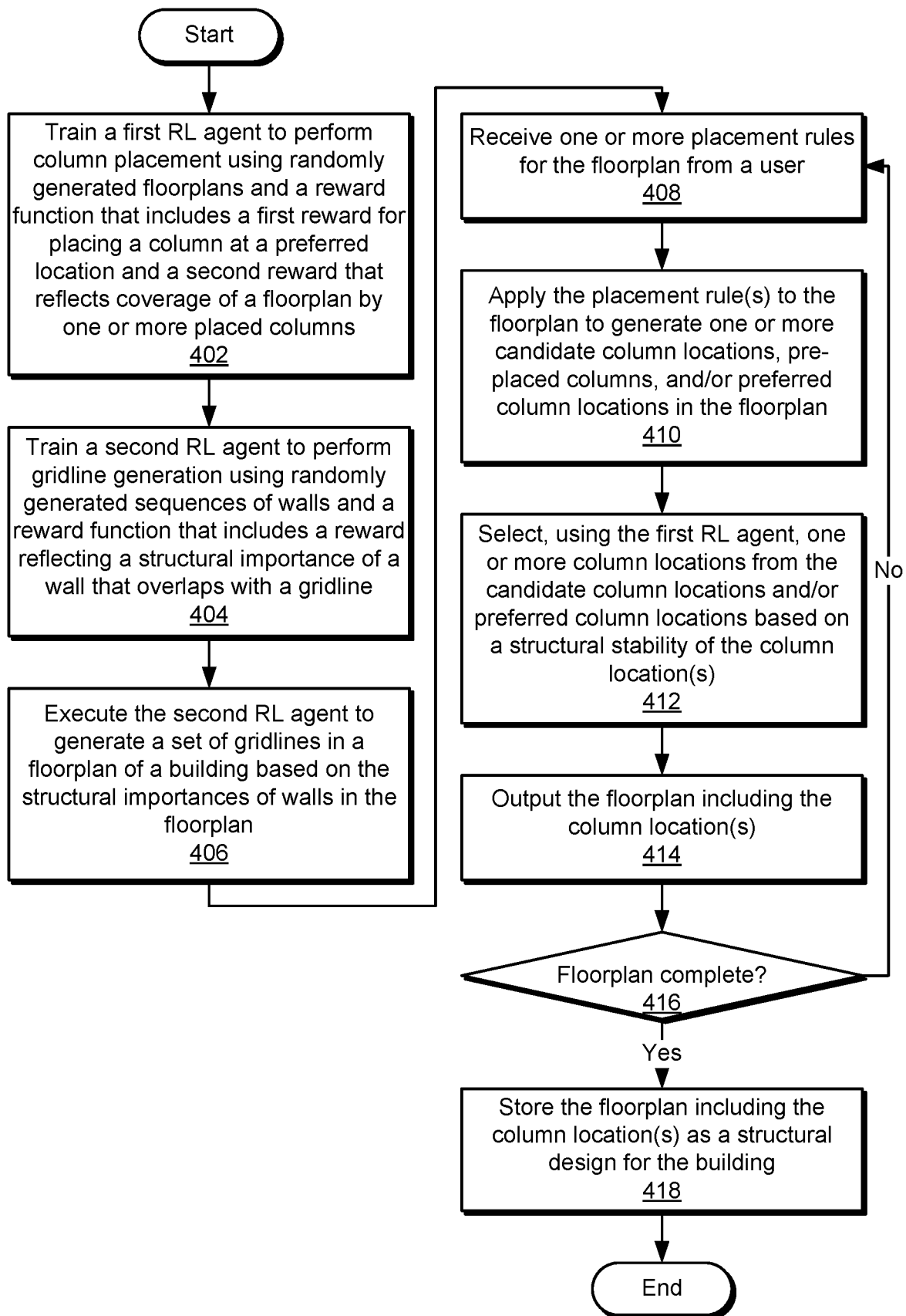
FIG. 4 is a flow chart of method steps for performing machine learning, according to various embodiments.

FIG. 4 is a flow chart of method steps for performing machine learning, according to various embodiments. Although the method steps are described in conjunction with the systems of FIGS. 1 and 2, persons skilled in the art will understand that any system configured to perform the method steps in any order falls within the scope of the present disclosure.

As shown, column placer 124 trains 402 a first RL agent to perform column placement using randomly generated floorplans and a reward function that includes a first reward for placing a column at a preferred location and a second reward that reflects coverage of a floorplan by one or more placed columns. For example, gridline generator 122 and/or column placer 124 may use an off-policy technique and randomly generated floorplans to train the first RL agent so that the first RL agent learns a policy for placing columns in a floorplan in a way that maximizes the reward.

Gridline generator 122 also trains 404 a second RL agent to perform gridline generation using randomly generated sequences of walls and a reward function that includes a reward reflecting a structural importance of a wall that overlaps with a gridline. For example, gridline generator 122 and/or column placer 124 may train the second RL agent to generate gridlines along walls that are perpendicular to a given axis (e.g., x-axis or y-axis), subject to the constraint that the distance between any two consecutive gridlines is greater than or equal to a minimum beam span and less than or equal to a maximum beam span.

Gridline generator 122 executes 406 the second RL agent to generate a set of gridlines in a floorplan based on the structural importances of walls in the floorplan. For example, each wall in the floorplan may be assigned a numeric weight representing the structural importance of the wall. The second RL agent may place gridlines along each of the x- and y-axes in a way that maximizes overlap with structurally important walls while maintaining spacings that stay within the range represented by the minimum and maximum beam spans for the floorplan. Gridline generator 122 may alternatively or additionally use other machine learning and/or gridline generation techniques to place gridlines in the floorplan, in lieu of or in addition to training and executing the second RL agent.

After the gridlines are added to the floorplan, column placer 124 receives 408 one or more placement rules for the floorplan from a user and applies 410 the placement rule(s) to the floorplan to generate one or more candidate column locations, pre-placed columns, and/or preferred column locations in the floorplan. For example, the user may define one or more placement rules and/or select one or more predefined placement rules (e.g., from other users and/or other structural design projects) for use with the floorplan.

Each placement rule may include one or more location parameters that describe locations in the floorplan (e.g., corners/boundaries of rooms, interiors of rooms, types of areas, etc.), as well as one or more parameters (e.g., a predicate) specifying a category (e.g., preferred column location, pre-placed column, invalid column location) associated with the floorplan. Column placer 124 may use an answer set solver and/or another type of solver to identify one or more gridline intersections that match the location parameter(s) and apply the category to the identified gridline intersection(s). The output of the solver may thus include different subsets of gridline intersections in the floorplan that have been categorized as candidate column locations, preferred column locations, pre-placed columns (i.e., locations at which columns are required), and/or invalid column locations.

Column placer 124 selects 412, using the first RL agent, one or more column locations from the candidate column locations and/or preferred column locations based on a structural stability of the column location(s). For example, the first RL agent may be initialized using a column placement task that includes the interior of the floorplan, candidate column locations, preferred column locations, and pre-placed columns, as well as the maximum beam span and/or maximum number of columns for the floorplan. The first RL agent may then place columns in the floorplan in a way that is structurally viable and maximizes rewards for increasing structural coverage of the interior of the floorplan, placing columns in preferred column locations, and/or fully covering the floorplan.

After the column placement task is complete, column placer 124 outputs 414 the floorplan including the column location(s). For example, column placer 124 displays the floorplan and column locations in a graphical user interface and/or another type of user interface to the user and/or exports the floorplan and column locations to a file.

Column placer 124 optionally repeats operations 408-414 until the floorplan is completed 416. For example, the user may update the placement rules after reviewing the outputted floorplan and column locations to specify new and/or different constraints on the column locations. In turn, column placer 124 may use the updated placement rules to generate new candidate column locations, pre-placed columns, and/or preferred column locations and use the first RL agent to select new column locations given the new candidate column locations, pre-placed columns, and/or preferred column locations. Column placer 124 may then output the new column locations in the floorplan to allow the user to review the new column locations and/or make further changes to the placement rules based on the new column locations. Consequently, column placer 124 may iteratively interact with the user to generate and revise column placements based on the user's requirements until a set of column locations that is structurally valid and meets the user's requirements and preferences is produced.

Finally, column placer 124 stores 418 the floorplan including the column location(s) as a structural design for the building. For example, column placer 124 may store the floorplan with the column location(s) in one or more files that can be viewed, shared, and/or further modified by one or more users.

In sum, the disclosed techniques combine customizable placement rules representing user requirements or preferences for column placement in structural design with a first RL agent that selects column locations in a floorplan according to the placement rules. A user may iteratively specify a new set of placement rules and review column locations generated in response to the placement rules until an acceptable and/or structurally viable set of column locations is identified in the floorplan. A second RL agent may also be used to generate horizontal and vertical gridlines in the floorplan; when a new set of placement rules is received from the user, the placement rules are applied to intersections of the gridlines to categorize different subsets of gridline intersections as candidate column locations, preferred column locations, and/or pre-placed columns in the floorplan. Some or all of these categorized gridline intersections are then provided as input to the first RL agent to allow the first RL agent to place additional columns in the candidate and/or preferred column locations.

By allowing a user to define, select, and/or customize placement rules for a column placement task and executing an RL agent that carries out the column placement task according to the placement rules, the disclosed techniques expedite and/or automate the column placement task for the user. As a result, column placement may be performed more efficiently and/or consume fewer resources than conventional column placement tools that are used by users over multiple hours or days to manually identify and review column locations in floorplans. Moreover, the RL agent and column placement task can be adapted to new sets of requirements and/or placement rules without retraining, which provides improved resource consumption and/or adaptability over conventional machine learning models that require retraining whenever changes to the behavior of the machine learning models are desired. Storing, grouping, and reuse of placement rules over multiple floorplans, projects, and/or column placement tasks additionally allows the domain knowledge and/or expertise of structural engineers and/or other domain experts to be captured and reused, which further improves the performance, adaptability, and resource efficiency of the disclosed column placement techniques. Consequently, the disclosed techniques provide technological improvements in computer systems, applications, tools, and/or techniques for performing column placement and/or machine learning.

1. In some embodiments, method for performing machine learning comprises applying one or more placement rules to a floorplan of a building to generate a set of candidate column locations in the floorplan; selecting, using a first reinforcement learning (RL) agent, one or more column locations from the set of candidate column locations based on a structural stability of the one or more column locations; and outputting the floorplan that includes the one or more column locations as a structural design for the building.

2. The method of clause 1, further comprising receiving one or more additional placement rules for the floorplan from a user; and revising, using the first RL agent, the one or more column locations selected from the set of candidate column locations based on the one or more additional placement rules.

3. The method of any of clauses 1-2, further comprising outputting an alert of a conflict in the one or more placement rules and the one or more additional placement rules upon detecting the conflict; and resolving the conflict based on input from a user prior to revising the one or more column locations.

4. The method of any of clauses 1-3, further comprising prior to applying the one or more placement rules to the floorplan, executing a second RL agent that generates a set of gridlines in the floorplan based on a set of structural importances of a set of walls in the floorplan.

5. The method of any of clauses 1-4, wherein the second RL agent further generates the set of gridlines in the floorplan based on a minimum beam span associated with the building and a maximum beam span associated with the building.

6. The method of any of clauses 1-5, wherein applying the one or more placement rules to the floorplan comprises matching a first parameter of a placement rule to an intersection of two gridlines in the set of gridlines; and applying a category to the intersection based on a second parameter of the placement rule.

7. The method of any of clauses 1-6, wherein applying the category to the intersection comprises at least one of omitting the intersection from the set of candidate column locations, including the intersection in the set of candidate column locations, and designating the intersection as a preferred column location.

8. The method of any of clauses 1-7, further comprising training the first RL agent with a set of randomly generated floorplans.

9. The method of any of clauses 1-8, further comprising training the first RL agent using a reward function that comprises a first reward for placing a column at a preferred column location.

10. The method of any of clauses 1-9, wherein the reward function further comprises a second reward that reflects coverage of a randomly generated floorplan by one or more placed columns.

11. The method of any of clauses 1-10, further comprising adding one or more pre-placed columns to the floorplan based on the one or more placement rules.

12. The method of any of clauses 1-11, wherein the floorplan comprises a first outline of the building, a second outline of an area in the building, and a functional type of the area.

13. In some embodiments, a non-transitory computer readable medium storing instructions that, when executed by a processor, cause the processor to perform the steps of applying one or more placement rules to a floorplan of a building to generate a set of candidate column locations and a set of preferred column locations in the floorplan; selecting, using a first reinforcement learning (RL) agent, one or more column locations from the set of candidate column locations and the set of preferred column locations based on a structural stability of the one or more column locations; and outputting the floorplan that includes the one or more column locations as a structural design for the building.

14. The non-transitory computer readable medium of clause 13, wherein the steps further comprise prior to applying the one or more placement rules to the floorplan, executing a second RL agent that generates a set of gridlines in the floorplan based on a set of structural importances of a set of walls in the floorplan, a minimum beam span associated with the building, and a maximum beam span associated with the building.

15. The non-transitory computer readable medium of any of clauses 13-14, wherein applying the one or more placement rules to the floorplan comprises matching a first parameter of a placement rule to an intersection of two gridlines in the set of gridlines; and applying a category to the intersection based on a second parameter of the placement rule.

16. The non-transitory computer readable medium of any of clauses 13-15, wherein applying the category to the intersection comprises at least one of omitting the intersection from the set of candidate column locations, including the intersection in the set of candidate column locations, and designating the intersection as a preferred column location.

17. The non-transitory computer readable medium of any of clauses 13-16, wherein the steps further comprise receiving one or more additional placement rules for the floorplan from a user; updating the set of candidate column locations and the set of preferred column locations based on the one or more additional placement rules; and revising, using the first RL agent, the one or more column locations selected from the updated set of candidate column locations and the updated set of preferred column locations based on the one or more additional placement rules.

18. The non-transitory computer readable medium of any of clauses 13-17, wherein the steps further comprise training the first RL agent based on a set of randomly generated floorplans and a reward function that comprises a first reward for placing a column at a preferred column location and a second reward that reflects coverage of a randomly generated floorplan by one or more placed columns.

19. The non-transitory computer readable medium of any of clauses 13-18, wherein the steps further comprise adding one or more pre-placed columns to the floorplan based on the one or more placement rules.

20. In some embodiments, a system comprises a memory that stores instructions, and a processor that is coupled to the memory and, when executing the instructions, is configured to execute a first reinforcement learning (RL) agent that generates a set of gridlines in a floorplan of a building based on a set of structural importances of a set of walls in the floorplan; apply one or more placement rules to one or more intersections of the set of gridlines to generate a set of candidate column locations and one or more pre-placed columns in the floorplan; select, using a second RL agent, one or more column locations from the set of candidate column locations based on a structural stability of the one or more column locations; and output the floorplan that includes the one or more column locations as a structural design for the building.

Any and all combinations of any of the claim elements recited in any of the claims and/or any elements described in this application, in any fashion, fall within the contemplated scope of the present invention and protection.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "module," a "system," or a "computer." In addition, any hardware and/or software technique, process, function, component, engine, module, or system described in the present disclosure may be implemented as a circuit or set of circuits. Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine. The instructions, when executed via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable gate arrays.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

What is claimed is:

1. A method comprising:
applying one or more placement rules to a floorplan of a building to generate a set of candidate column locations in the floorplan;
selecting, via a first reinforcement learning (RL) agent that comprises a first machine learning model executed by a processor, one or more column locations from the set of candidate column locations based on a structural stability of the one or more column locations; and
outputting the floorplan that includes the one or more column locations as a structural design for the building.

2. The method of claim 1, further comprising:
receiving one or more additional placement rules for the floorplan from a user; and
revising, using the first RL agent, the one or more column locations selected from the set of candidate column locations based on the one or more additional placement rules.

3. The method of claim 2, further comprising:
outputting an alert of a conflict in the one or more placement rules and the one or more additional placement rules upon detecting the conflict; and
resolving the conflict based on input from a user prior to revising the one or more column locations.

4. The method of claim 1, further comprising prior to applying the one or more placement rules to the floorplan, executing a second RL agent that generates a set of gridlines in the floorplan based on a set of structural importances of a set of walls in the floorplan.

5. The method of claim 4, wherein the second RL agent further generates the set of gridlines in the floorplan based on a minimum beam span associated with the building and a maximum beam span associated with the building.

6. The method of claim 4, wherein applying the one or more placement rules to the floorplan comprises:
matching a first parameter of a placement rule to an intersection of two gridlines in the set of gridlines; and
applying a category to the intersection based on a second parameter of the placement rule.

7. The method of claim 6, wherein applying the category to the intersection comprises at least one of omitting the intersection from the set of candidate column locations, including the intersection in the set of candidate column locations, and designating the intersection as a preferred column location.

8. The method of claim 1, further comprising training the first RL agent with a set of randomly generated floorplans.

9. The method of claim 8, further comprising training the first RL agent using a reward function that comprises a first reward for placing a column at a preferred column location.

10. The method of claim 9, wherein the reward function further comprises a second reward that is based on an area of a randomly generated floorplan that is covered by one or more placed columns.

11. The method of claim 1, further comprising adding one or more pre-placed columns to the floorplan based on the one or more placement rules.

12. The method of claim 1, wherein the floorplan comprises a first outline of the building, a second outline of an area in the building, and a functional type of the area.

13. A non-transitory computer readable medium storing instructions that, when executed by a processor, cause the processor to perform the steps of:
applying one or more placement rules to a floorplan of a building to generate a set of candidate column locations and a set of preferred column locations in the floorplan;
selecting, via a first reinforcement learning (RL) agent that comprises a first machine learning model executed by a processor, one or more column locations from the set of candidate column locations and the set of preferred column locations based on a structural stability of the one or more column locations; and
outputting the floorplan that includes the one or more column locations as a structural design for the building.

14. The non-transitory computer readable medium of claim 13, wherein the steps further comprise prior to applying the one or more placement rules to the floorplan, executing a second RL agent that generates a set of gridlines in the floorplan based on a set of structural importances of a set of walls in the floorplan, a minimum beam span associated with the building, and a maximum beam span associated with the building.

15. The non-transitory computer readable medium of claim 14, wherein applying the one or more placement rules to the floorplan comprises:
matching a first parameter of a placement rule to an intersection of two gridlines in the set of gridlines; and
applying a category to the intersection based on a second parameter of the placement rule.

16. The non-transitory computer readable medium of claim 15, wherein applying the category to the intersection comprises at least one of omitting the intersection from the set of candidate column locations, including the intersection in the set of candidate column locations, and designating the intersection as a preferred column location.

17. The non-transitory computer readable medium of claim 13, wherein the steps further comprise:
receiving one or more additional placement rules for the floorplan from a user;
updating the set of candidate column locations and the set of preferred column locations based on the one or more additional placement rules; and
revising, using the first RL agent, the one or more column locations selected from the updated set of candidate column locations and the updated set of preferred column locations based on the one or more additional placement rules.

18. The non-transitory computer readable medium of claim 13, wherein the steps further comprise training the first RL agent based on a set of randomly generated floorplans and a reward function that comprises a first reward for placing a column at a preferred column location and a second reward that is based on an area of a randomly generated floorplan that is covered by one or more placed columns.

19. The non-transitory computer readable medium of claim 13, wherein the steps further comprise adding one or more pre-placed columns to the floorplan based on the one or more placement rules.

20. A system, comprising:
a memory that stores instructions, and a processor that is coupled to the memory and, when executing the instructions, is configured to:
execute a first reinforcement learning (RL) agent that generates a set of gridlines in a floorplan of a building based on a set of structural importances of a set of walls in the floorplan;
apply one or more placement rules to one or more intersections of the set of gridlines to generate a set of candidate column locations and one or more pre-placed columns in the floorplan;
select, via a second RL agent that comprises a machine learning model executed by the processor, one or more column locations from the set of candidate column locations based on a structural stability of the one or more column locations; and
output the floorplan that includes the one or more column locations as a structural design for the building.

* * * * *